(12) United States Patent
Chen et al.

(10) Patent No.: US 8,644,021 B2
(45) Date of Patent: Feb. 4, 2014

(54) COOLING MODULE

(75) Inventors: Chien-An Chen, Taipei (TW); Yi-Ling Chen, Taipei (TW)

(73) Assignee: Inventec Corporation, Taipei (TW)

( * ) Notice: Subject to any disclaimer, the term of this patent is extended or adjusted under 35 U.S.C. 154(b) by 227 days.

(21) Appl. No.: 13/327,894

(22) Filed: Dec. 16, 2011

(65) Prior Publication Data
US 2013/0135822 A1    May 30, 2013

(30) Foreign Application Priority Data
Nov. 25, 2011 (TW) .............................. 100143337 A

(51) Int. Cl.
*H05K 7/20* (2006.01)

(52) U.S. Cl.
USPC ............... 361/679.52; 361/679.53; 361/689; 361/700; 165/80.4; 165/80.5; 174/15.2

(58) Field of Classification Search
None
See application file for complete search history.

(56) References Cited

U.S. PATENT DOCUMENTS

| | | | |
|---|---|---|---|
| 6,536,510 B2 * | 3/2003 | Khrustalev et al. | 165/104.33 |
| 6,804,117 B2 * | 10/2004 | Phillips et al. | 361/700 |
| 6,966,363 B2 * | 11/2005 | Gailus et al. | 165/185 |
| 7,177,154 B2 * | 2/2007 | Lee | 361/704 |
| 7,339,787 B2 * | 3/2008 | Cheng et al. | 361/695 |
| 7,440,278 B2 * | 10/2008 | Cheng | 361/699 |
| 7,656,665 B2 * | 2/2010 | Lin et al. | 361/700 |
| 7,986,520 B2 * | 7/2011 | Yamaguchi et al. | 361/679.47 |
| 8,050,038 B2 * | 11/2011 | Chen et al. | 361/719 |
| 8,085,539 B2 * | 12/2011 | Yang | 361/700 |
| 2006/0144567 A1 * | 7/2006 | Zhu et al. | 165/104.29 |

* cited by examiner

*Primary Examiner* — Boris Chervinsky
(74) *Attorney, Agent, or Firm* — CKC & Partners Co., Ltd.

(57) ABSTRACT

A cooling module applicable in an electronic device is provided. The electronic device includes a plurality of first heat sources and a plurality of second heat sources. The cooling module includes a cooling loop and a plurality of heat pipes. The cooling loop includes a plurality of cooling units. The cooling units are connected in series through a plurality of connection tube and each cooling unit is thermally coupled to one of the first heat source. The heat pipes are thermally coupled to the second heat sources and the cooling units. When the cooling unit is in failure, the cooling units can be directly removed and replaced. Also, the second heat sources of the electronic device are capable of exchanging heat with the cooling unit through the heat pipe.

22 Claims, 6 Drawing Sheets

COOLING MODULE

CROSS-REFERENCE TO RELATED APPLICATION

This application claims the priority benefit of Taiwan application serial no. 100143337, filed Nov. 25, 2011. The entirety of the above-mentioned patent application is hereby incorporated by reference herein and made a part of this specification.

BACKGROUND OF THE INVENTION

1. Field of the Invention

The present invention generally relates to a cooling module, in particular, to a cooling module applicable in an electronic device.

2. Description of Related Art

A server is a core computer that services computers in a network system, can provide functions of a disk and printing services that are required by network users, and at the same time, can enable user terminals to share resources in the network environment with each other.

With the advance of technology, the amount of data that is processed by the server and the operation speed are continuously increased, so that the heating power of electronic elements in the server is raised. In order to prevent the electronic elements from getting overheated and avoid the occurrence of temporary or permanent failure, the server needs to have sufficient heat dissipation efficiency. Generally, the main heating source in the server is the central processing unit (CPU). A single server is always arranged with a plurality of CPUs. Therefore, when the server is operated, the temperature in a casing rapidly rises.

Presently, in many cooling modules applied in a server, change of two phases of a cooling fluid is utilized to cool heating sources. The cooling module includes a plurality of cooling units that contact with a CPU, and when the cooling fluid flows through the cooling units, the cooling fluid can take away a part of heat generated by the CPU. However, when a single cooling unit is in failure, the whole cooling module always needs to be replaced.

Further, besides the CPU in the server, many heating sources exist, for example, a platform controller hub or a voltage regulator down (VRD). Heat generated by this type of heating sources is not as much as that generated by the CPU, but the number and type of this type of heating sources are numerous, so the total heat generated is considerable. Presently, the cooling module applied in a server is seldom used to dissipate heat generated by this type of heating sources.

SUMMARY OF THE INVENTION

Accordingly, the present invention is directed to a cooling module, in which cooling units are connected in series to each other in a removable manner.

The present invention provides a cooling module, which can dissipate heat for heating sources other than a central processing unit (CPU).

The present invention provides a cooling module, which is applicable in an electronic device. The electronic device includes a plurality of first heat sources and a plurality of second heat sources. The cooling module includes a cooling loop and a plurality of heat pipes, and the cooling loop includes a plurality of cooling units. The cooling units are connected in series through a plurality of connection tubes and each cooling unit is thermally coupled to one of the corresponding first heat sources, and the heat pipes are thermally coupled to the second heat sources and the cooling units.

In an embodiment of the present invention, the cooling loop includes a plurality of leakage proof pipes and a plurality of fixing members. Each leakage proof pipe is located between the corresponding connection tube and cooling unit, and each leakage proof pipe includes at least one annular groove and at least one annular sealing member. The at least one annular sealing member is disposed at the at least one annular groove, and the fixing members are used for fixing the leakage proof pipes at the cooling units.

The present invention further provides a cooling module, which is applicable in an electronic device. The electronic device includes a first heat source and a second heat source. The cooling module includes a cooling unit and a heat pipe. The cooling unit is thermally coupled to the first heat source, and one cooling fluid flows through the cooling unit for heat exchange. The heat pipe is thermally coupled to the second heat source and the cooling unit.

Based on the above, as the cooling units of the cooling module of the present invention are connected in series to each other in a removable manner, when one of the cooling units is in failure, the cooling unit can be directly detached and replaced. Furthermore, the cooling module of the present invention is thermally coupled to the second heat source and the cooling unit through a heat pipe, so that the heat generated by the second heat source may be transferred to the cooling unit through the heat pipe for heat exchange.

In order to make the aforementioned and other objectives and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
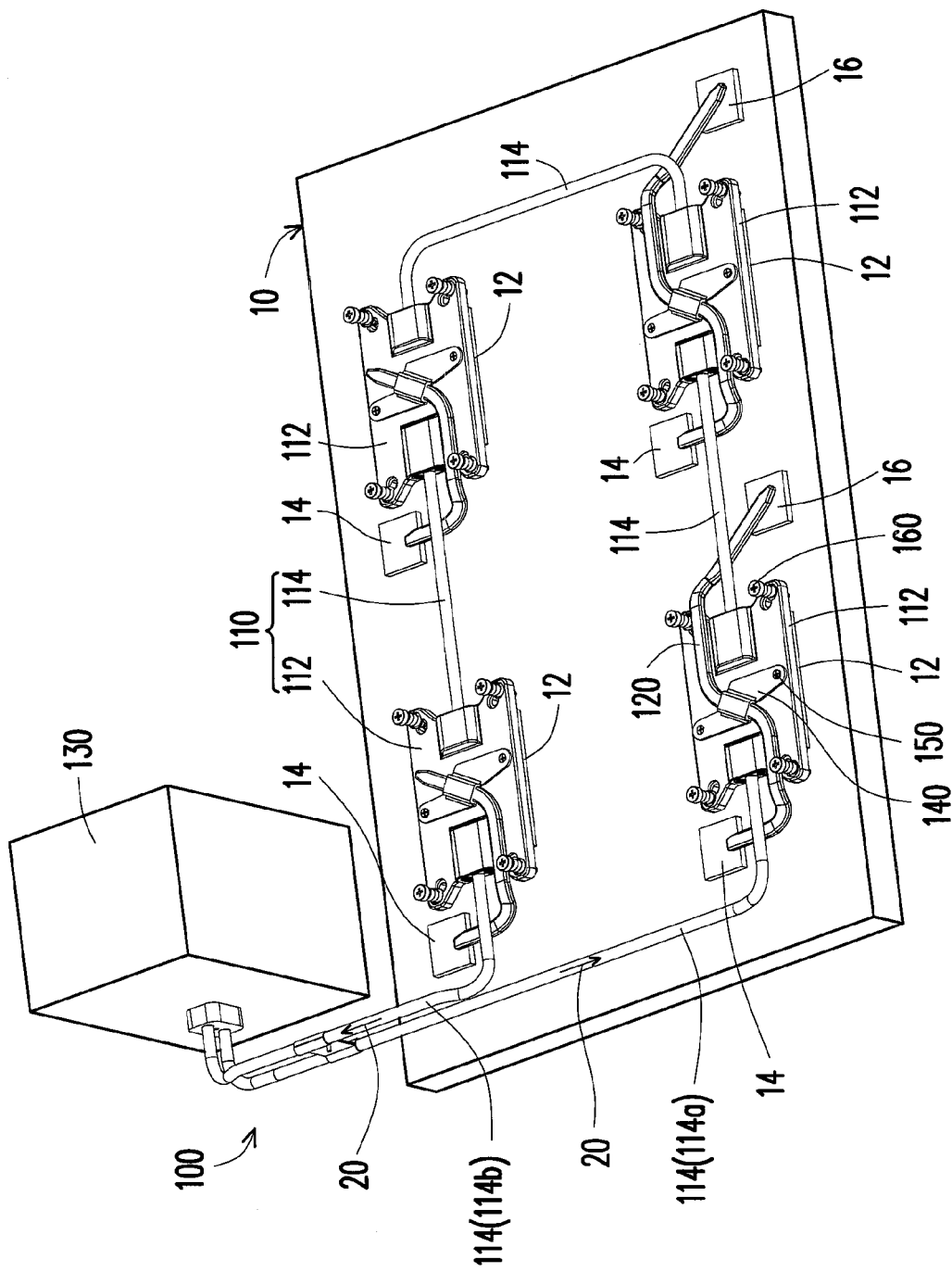
FIG. 1A is a schematic three-dimensional view of a cooling module disposed in an electronic device according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 1B:
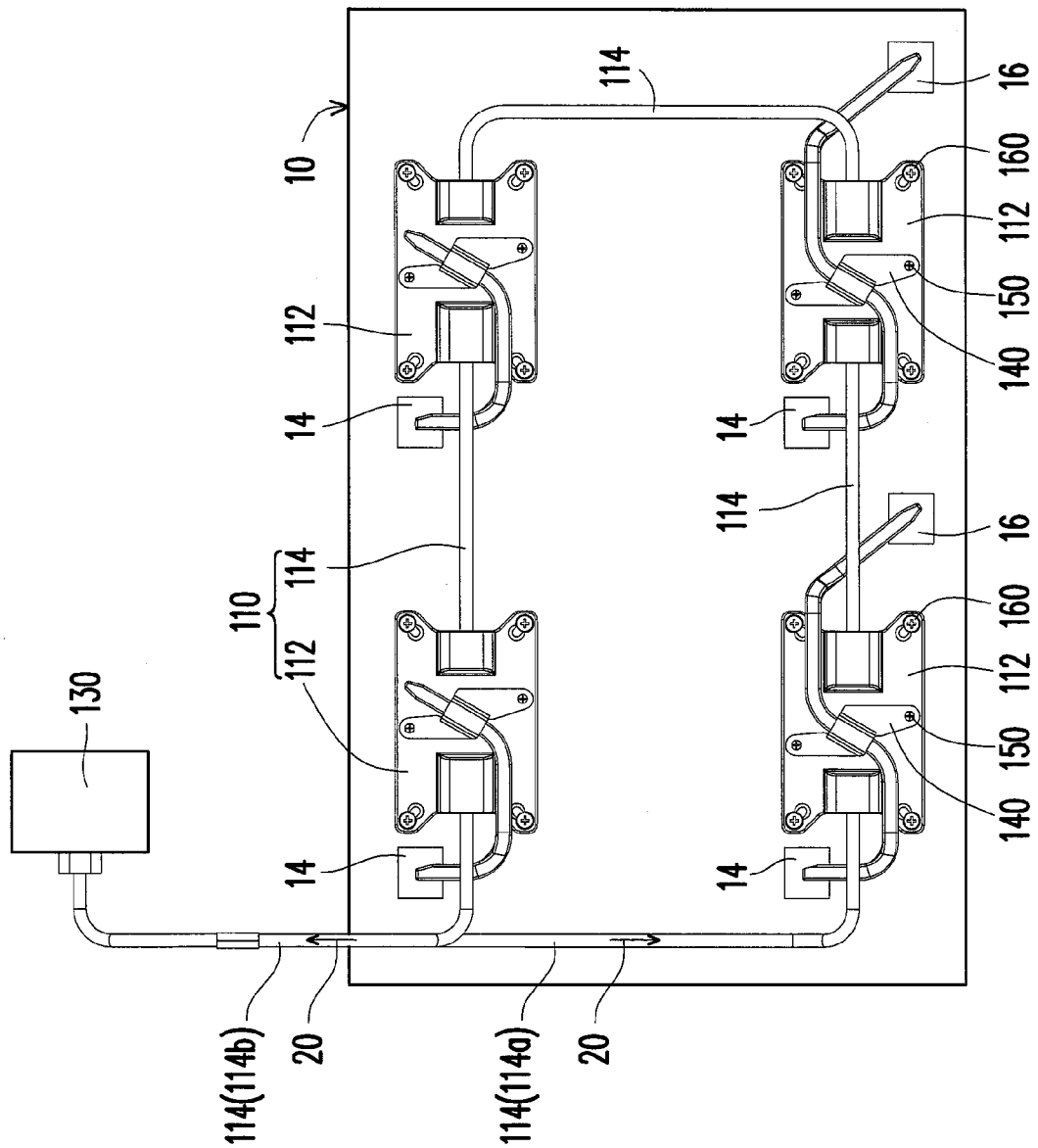
FIG. 1B is a schematic top view of the cooling module in FIG. 1A disposed in an electronic device.

The present invention provides a cooling module applicable in an electronic device. The electronic device at least includes a plurality of first heat sources and a plurality of second heat sources. FIG. 1A is a schematic three-dimensional view of a cooling module disposed in an electronic device according to an embodiment of the present invention. FIG. 1B is a schematic top view of the cooling module in FIG. 1A disposed in an electronic device.

Referring to FIG. 1A and FIG. 1B, the electronic device 10 includes a plurality of first heat sources 12, a plurality of second heat sources 14, and a plurality of third heat sources 16. The cooling module 100 includes a cooling loop 110, a plurality of heat pipes 120, and a heat dissipation device 130. The cooling loop 110 includes a plurality of cooling units 112 and a plurality of connection tubes 114. The cooling units 112 are connected in series through the connection tubes 114. Each cooling unit 112 is thermally coupled to one of the first heat sources 12, for performing heat exchange with the first heat source 12.

As shown in FIG. 1A and FIG. 1B, the second heat source 14 and the third heat source 16 are disposed at two ends of the heat pipe 120. As the second heat sources 14 and the third heat source 16 contact with the heat pipe 120, and the heat pipe 120 contacts with the cooling unit 112. The cooling unit 112, the second heat source 14, and the third heat source 16 are thermally coupled through the heat pipe 120, so that the second heat source 14 and the third heat source 16 can perform heat exchange with the cooling unit 112, so as to prevent the second heat source 14 and the third heat source 16 from being continuously heated.

In this embodiment, the connection tube 114 includes an inlet tube 114a and an outlet tube 114b, and the inlet tube 114a and the outlet tube 114b are connected to the heat dissipation device 130. The cooling module 100 of this embodiment enables a cooling fluid 20 to flow through, and the cooling fluid 20 enters the cooling unit 112 from the heat dissipation device 130 through the inlet tube 114a, and flows through the outlet tube 114b and returns to the heat dissipation device 130. When the cooling fluid 20 returns to the heat dissipation device 130, the heat dissipation device 130 can absorb the heat of the cooling fluid 20, so that the cooling fluid 20 is cooled down. The cooled cooling fluid 20 can enter the cooling loop 110 again to absorb the heat generated by the first heat source 12, the second heat source 14, or the third heat source 16. In this embodiment, the cooling fluid 20 is coolant or water.

When the electronic device 10 is operated, the heat generated by the first heat source 12, the second heat source 14, or the third heat source 16 are transferred to the cooling unit 112. The cooling fluid 20 that flows through the cooling unit 112 absorbs the heat and is heated, or phase change occurs. Therefore, a part of the cooling fluid 20 is vaporized after flowing through the cooling units 112, so that the pressure of the outlet tube 114b is greater than the pressure of the inlet tube 114a. In order to enable the cooling fluid 20 to rapidly return to the heat dissipation device 130 and be cooled down and prevent the pressure of the outlet tube 114b from getting excessively high, in this embodiment, the heat dissipation device 130 is disposed at a site close to the outlet tube 114b, and the length of the outlet tube 114b is less than the length of the inlet tube 114a, so that the cooling fluid 20 can return to the heat dissipation device 130 through a short path.

In this embodiment, the electronic device 10 is a server, the first heat source 12 is a CPU, the second heat source 14 may be various types of chips or a controller hub such as a south bridge chip, a north bridge chip, a graphics and memory controller hub (MCH), a platform controller hub (PCH), or an I/O controller hub, and the third heat source 16 may be a voltage regulator down (VRD) or a power control chip. However, the type of the electronic device 10, the first heat source 12, the second heat source 14, and the third heat source 16 are not limited to the types mentioned above, and may be any electronic elements that may cause high temperature.

Figure 2:
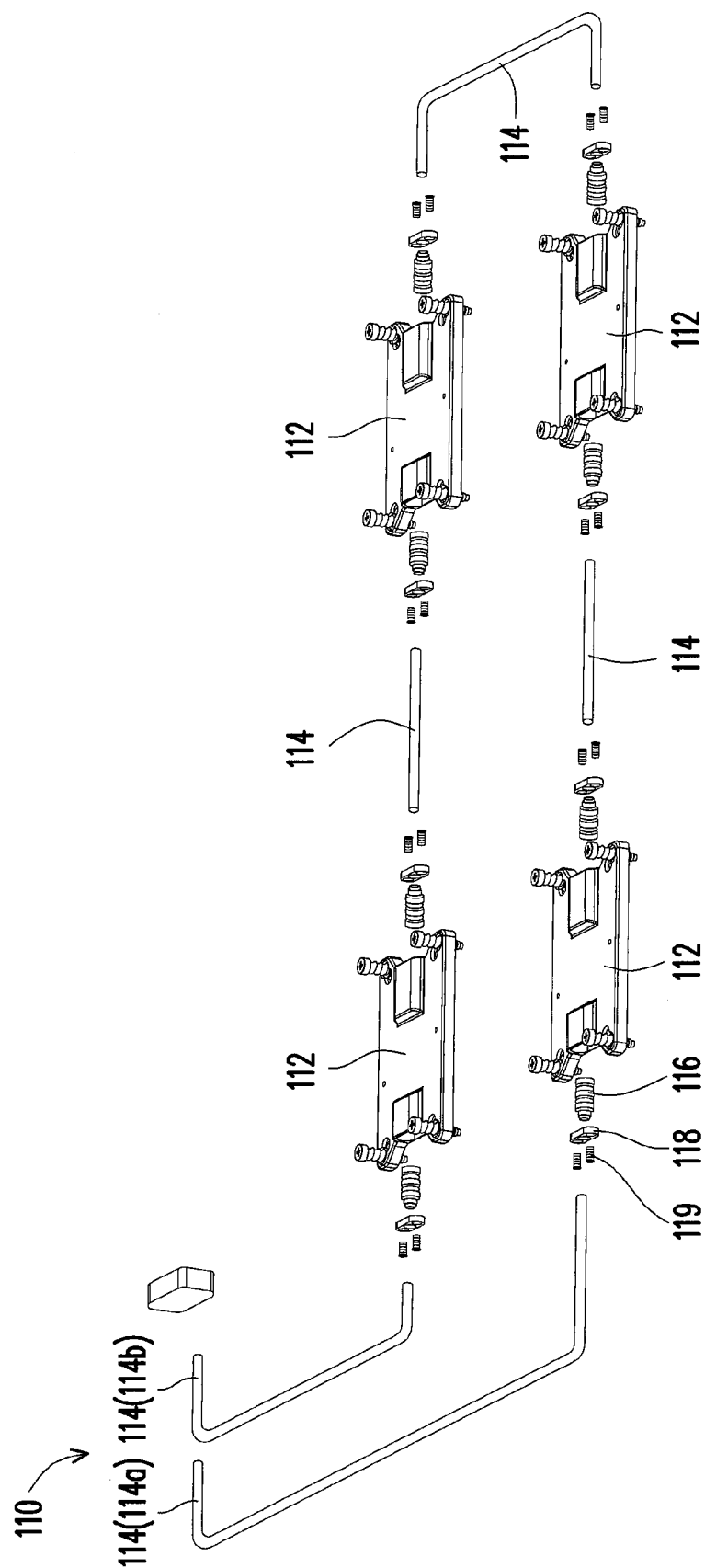
FIG. 2 is a schematic exploded view of a cooling loop of the cooling module in FIG. 1A.

FIG. 2 is a schematic exploded view of a cooling loop of the cooling module in FIG. 1A. As shown in FIG. 2, the cooling loop 110 further includes a plurality of leakage proof pipes 116, a plurality of fixing members 118, and a plurality of screws 119. Each connection tube 114 and each leakage proof pipe 116 are connected to the corresponding cooling unit 112 in a removable manner. Therefore, when one cooling unit 112 of the cooling module of this embodiment is in failure, the operator may remove the faulty cooling unit 112 and replace the faulty cooling unit 112 with a useful cooling unit 112, so that the cooling loop 110 can be re-operated.

Figure 3:
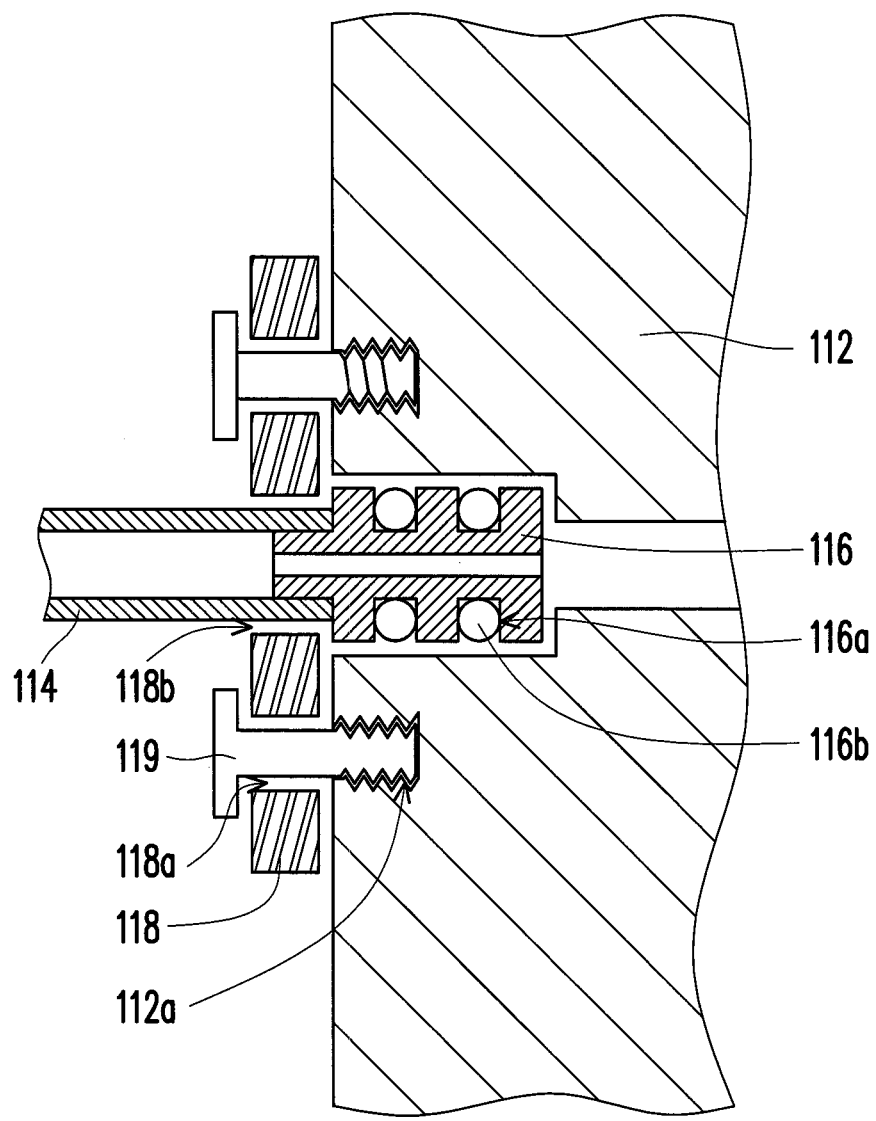
FIG. 3 is a schematic partial cross-sectional view of the cooling loop of the cooling module in FIG. 1A.

FIG. 3 is a schematic partial cross-sectional view of the cooling loop of the cooling module in FIG. 1A. Referring to FIG. 3, the leakage proof pipe 116 is fixed to the connection tube 114, and in this embodiment, the leakage proof pipe 116 is fixed to the connection tube 114 with welding. The leakage proof pipe 116 includes two annular grooves 116a and two annular sealing members 116b, but the number of the annular groove 116a and the annular sealing member 116b is not limited thereto. The annular sealing members 116b are disposed in the annular grooves 116a respectively. When the leakage proof pipe 116 is connected to the cooling unit 112, the annular sealing members 116b can make the leakage proof pipe 116 and the cooling unit 112 closed, so that the cooling fluid 20 will not leak.

The fixing member 118 includes two first through holes 118a and a second through hole 118b, the cooling unit 112 includes two screw holes 112a, and the leakage proof pipe 116 is located between the fixing member 118 and the cooling unit 112. When the screws 119 pass through the first through holes 118a and are fixed in the screw holes 112a, the leakage proof pipe 116 is fixed to the cooling unit 112. At this time, a part of the leakage proof pipe 116 is located in the second through hole 118b.

Figure 4:
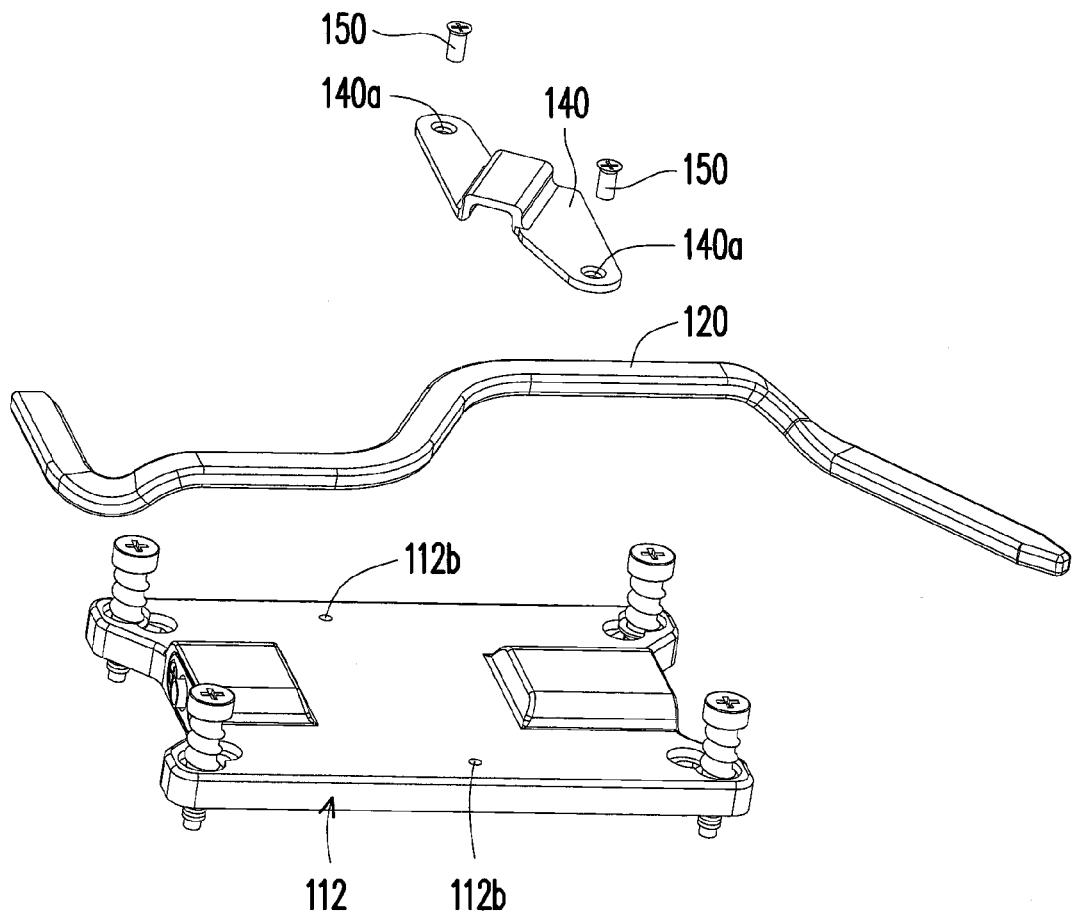
FIG. 4 is a schematic exploded view of a cooling unit, a heat pipe, and a heat dissipation plate of the cooling module in FIG. 1A.

FIG. 4 is a schematic exploded view of a cooling unit, a heat pipe, and a heat dissipation plate of the cooling module in FIG. 1A. Referring to FIG. 4, in order to improve the efficiency of heat exchange between the heat pipe 120 and the cooling unit 112, the cooling module 100 further includes a plurality of heat dissipation plates 140 and a plurality of first fixing units 150. The cooling unit 112 includes at least one second fixing unit 112b. In this embodiment, the first fixing units 150 are screws, and the second fixing units 112b are screw holes. The heat pipe 120 is located between the heat dissipation plate 140 and the cooling unit 112, and the heat dissipation plate 140 includes at least one hole 140a. Each first fixing unit 150 may pass through the corresponding hole 140a and is locked to the corresponding second fixing unit 112b.

When the first fixing unit 150 is fixed to the second fixing unit 112b (as shown in FIG. 1A and FIG. 1B), the cooling unit 112, the heat pipe 120, and the heat dissipation plate 140 contact with each other. At this time, the heat pipe 120 is not only fixed to the cooling unit 112, but also the contact area between the heat pipe 120 and the cooling unit 112 is increased.

Figure 5:
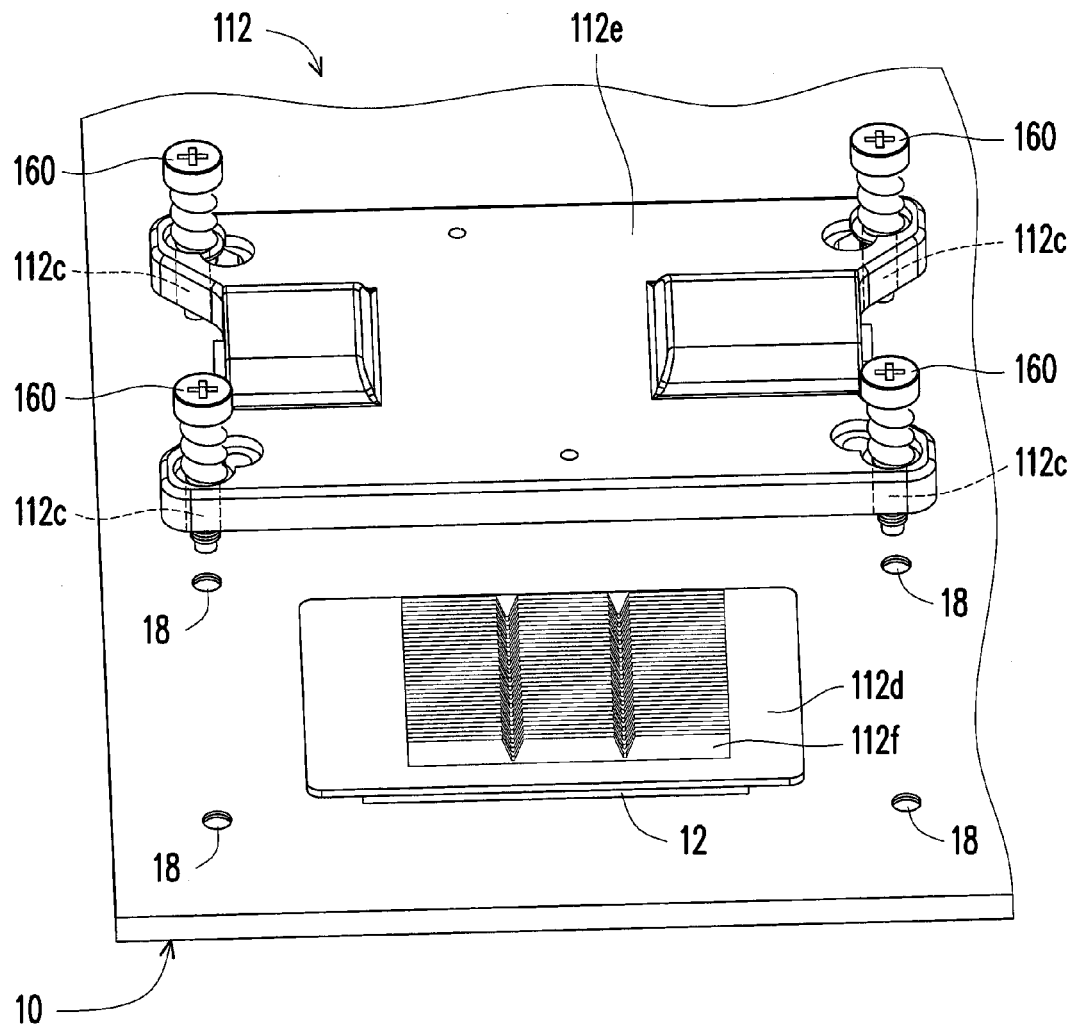
FIG. 5 is a schematic partial exploded view of a cooling unit of the cooling module in FIG. 1A and an electronic device.

FIG. 5 is a schematic partial exploded view of a cooling unit of the cooling module in FIG. 1A and an electronic device. Referring to FIG. 5, the cooling module 100 further includes a plurality of first fixing parts 160, and the electronic device 10 includes a plurality of second fixing parts 18, located around the first heat source 12. In this embodiment, the first fixing parts 160 are screws, the second fixing parts 18 are screw holes. The cooling unit 112 includes a plurality of through holes 112c, each first fixing part 160 passes through the corresponding through hole 112c and is locked to the corresponding second fixing part 18, so that the cooling unit 112 contacts with the first heat source 12.

As shown in FIG. 5, the cooling unit 112 includes a cooling base plate 112d, a cooling cover plate 112e, and a plurality of cooling fins 112f. The cooling base plate 112d contacts with the first heat source 12. The cooling fins 112f are used for increasing the contact area with the cooling fluid 20, and the cooling cover plate 112e is disposed over the cooling base plate 112d and covers the cooling fins 112f therein, but the type of the cooling unit 112 is not limited thereto.

The cooling units of the cooling module of the present invention are connected in series to each other in a removable manner, and when one cooling unit is in failure, the cooling unit can be directly removed and replaced. Besides, the cooling module of the present invention is thermally coupled to the second heat source and the cooling unit through the heat pipe, so that the heat generated by the second heat source can be transferred to the cooling unit through the heat pipe for heat exchange.

In view of the above, the cooling module of the present invention has the advantage of convenient maintenance. Furthermore, besides the CPU of the server, the cooling module of the present invention can also provide heat dissipation for other heating sources to decrease the temperature of the electronic device, so as to effectively reduce the probability of temporary or permanent failure of the electronic element because the electronic element is excessively heated It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cooling module, applicable in an electronic device, wherein the electronic device comprises a plurality of first heat sources and a plurality of second heat sources, the cooling module comprising:
   a cooling loop, comprising a plurality of cooling units, wherein the cooling units are connected in series and thermally coupled to the first heat sources; and
   a plurality of heat pipes, thermally coupled to the second heat sources and the cooling units.

2. The cooling module according to claim 1, wherein the cooling loop comprises a plurality of connection tubes connected to the cooling units in a removable manner.

3. The cooling module according to claim 2, wherein the cooling loop comprises a plurality of leakage proof pipes fixed to two ends of each connection tube and connected to the corresponding cooling units in a removable manner, each leakage proof pipe comprises at least one annular groove and at least one annular sealing member, and the at least one annular sealing member is disposed at the at least one annular groove.

4. The cooling module according to claim 3, wherein the cooling loop comprises a plurality of fixing members and a plurality of screws, each fixing member comprises a plurality of first through holes, the leakage proof pipes are located between the fixing members and the cooling units, the cooling unit comprises a plurality of screw holes, when the screws pass through the first through holes and are fixed in the screw holes, the leakage proof pipes are fixed to the cooling units.

5. The cooling module according to claim 4, wherein each fixing member comprises a plurality of second through holes, and a part of each leakage proof pipe is located in the corresponding second through hole.

6. The cooling module according to claim 2, further comprising a heat dissipation device, wherein the connection tubes comprises an inlet tube and an outlet tube, the inlet tube and the outlet tube are connected to the heat dissipation device, and a cooling fluid enters the cooling units from the heat dissipation device through the inlet tube, and returns to the heat dissipation device through the outlet tube, and the length of the outlet tube is less than the length of the inlet tube.

7. The cooling module according to claim 1, further comprising a plurality of heat dissipation plates and a plurality of first fixing units, wherein each cooling unit comprises at least one second fixing unit, the heat pipes are located between the heat dissipation plates and the cooling units, when the first fixing units are fixed to the second fixing units, the cooling units, the heat pipes, and the heat dissipation plates contact with each other.

8. The cooling module according to claim 7, wherein the first fixing units are screws, the second fixing units are screw holes, each heat dissipation plate comprises at least one hole, and the first fixing units pass through the holes and are locked to the second fixing units.

9. The cooling module according to claim 1, further comprising a plurality of first fixing parts, wherein the electronic device comprises a plurality of second fixing parts located around the first heat sources, the first fixing parts are locked to the second fixing parts, so that the cooling units contact with the first heat sources.

10. The cooling module according to claim 9, wherein the first fixing parts are screws, the second fixing parts are screw holes, the cooling units comprise a plurality of through holes, and the first fixing parts pass through the through holes and are locked to the second fixing parts.

11. The cooling module according to claim 1, wherein each cooling unit comprises a cooling base plate, a cooling cover plate, and a plurality of cooling fins, the cooling cover plate is disposed over the cooling base plate and covers the cooling fins therein.

12. The cooling module according to claim 11, wherein the cooling base plate contacts with the first heat source.

13. The cooling module according to claim 1, wherein the electronic device further comprises a plurality of third heat sources, and each third heat source is thermally coupled to one of the heat pipes respectively.

14. The cooling module according to claim 13, wherein the first heat source is a central processing unit (CPU), the second heat source is a platform controller hub (PCH) and the third heat source is a voltage regulator down (VRD).

15. A cooling module, applicable in an electronic device, wherein the electronic device comprises a first heat source and a second heat source, the cooling module comprising:
   a cooling unit, thermally coupled to the first heat source, wherein a cooling fluid flows through the cooling unit for heat exchange; and
   a heat pipe, thermally coupled to the second heat source and the cooling unit.

16. The cooling module according to claim 15, further comprising a heat dissipation plate and at least one first fixing unit, wherein the cooling unit comprises at least one second fixing unit, the heat pipe is located between the heat dissipation plate and the cooling unit, and when the first fixing unit is fixed to the second fixing unit, the heat dissipation plate, the heat pipe, and the cooling unit contact with each other.

17. The cooling module according to claim 16, wherein the first fixing unit is a screw, the second fixing units is a screw, the heat dissipation plate comprises at least one hole, and the first fixing unit pass through the at least one hole and is locked to the second fixing unit.

18. The cooling module according to claim 15, further comprising a plurality of first fixing parts, wherein the electronic device comprises a plurality of second fixing parts, the second fixing parts are located around the first heat source, and the first fixing parts are connected to the second fixing parts, so that the cooling unit contacts with the first heat source.

19. The cooling module according to claim 18, wherein the first fixing parts are screws, the second fixing parts are screw holes, the cooling unit comprises a plurality of through holes, and the first fixing parts pass through the through holes and are locked to the second fixing parts.

20. The cooling module according to claim 15, wherein the cooling unit comprises a cooling base plate, a cooling cover plate, and a plurality of cooling fins, and the cooling cover plate is disposed over the cooling base plate and covers the cooling fin therein.

21. The cooling module according to claim 20, wherein the cooling base plate contacts with the first heat source.

22. The cooling module according to claim 15, wherein the electronic device further comprises a plurality of third heat sources, and each third heat source is thermally coupled to one of the heat pipes respectively.

\* \* \* \* \*